United States Patent
Picollet et al.

(10) Patent No.: US 7,188,038 B2
(45) Date of Patent: Mar. 6, 2007

(54) METHOD OF DETERMINING AN ELECTRICAL CAPACITANCE OF A CIRCUIT COMPONENT AND METHOD OF DEFINING A DIMENSION OF SUCH A COMPONENT

(75) Inventors: Eric Picollet, La Ferriere (FR); Michel Minondo, Saint-Martin d'Heres (FR)

(73) Assignee: STMicroelectronics SA, Montrouge (FR)

( * ) Notice: Subject to any disclaimer, the term of this patent is extended or adjusted under 35 U.S.C. 154(b) by 10 days.

(21) Appl. No.: 10/669,083

(22) Filed: Sep. 23, 2003

(65) Prior Publication Data

US 2004/0130336 A1 Jul. 8, 2004

(30) Foreign Application Priority Data

Sep. 23, 2002 (FR) .................................. 02 11726

(51) Int. Cl.
*G01R 19/00* (2006.01)
(52) U.S. Cl. .............................. 702/65; 702/64; 702/57; 324/600; 324/649; 324/658
(58) Field of Classification Search ................. 702/65, 702/64, 57; 324/600, 649, 658
See application file for complete search history.

(56) References Cited

U.S. PATENT DOCUMENTS

| 5,761,080 | A | 6/1998 | DeCamp et al. |
| 6,243,653 | B1 | 6/2001 | Findley |
| 6,388,344 | B1 | 5/2002 | Klotz et al. |
| 6,661,638 | B2 | 12/2003 | Jackson et al. |
| 6,774,448 | B1 * | 8/2004 | Lindemann et al. ........ 257/443 |
| 6,777,320 | B1 | 8/2004 | Chiang et al. |

* cited by examiner

*Primary Examiner*—John Barlow
*Assistant Examiner*—Stephen J. Cherry

(57) ABSTRACT

A method of estimating an electrical capacitance of a circuit component is carried out by decomposing the capacitance into a sum of terms associated with respective contributions from a central part and peripheral parts of the component. A component to which the method can be applied comprises two rectangular conducting plates placed parallel to each other. One of the two plates is greater than the other. The component furthermore includes two different dielectrics. A first dielectric covers the large plate and separates the two plates, and a second dielectric surrounds the first plate and the first dielectric. A method of defining a dimension of a capacitor is also presented.

28 Claims, 4 Drawing Sheets

FIG.4.
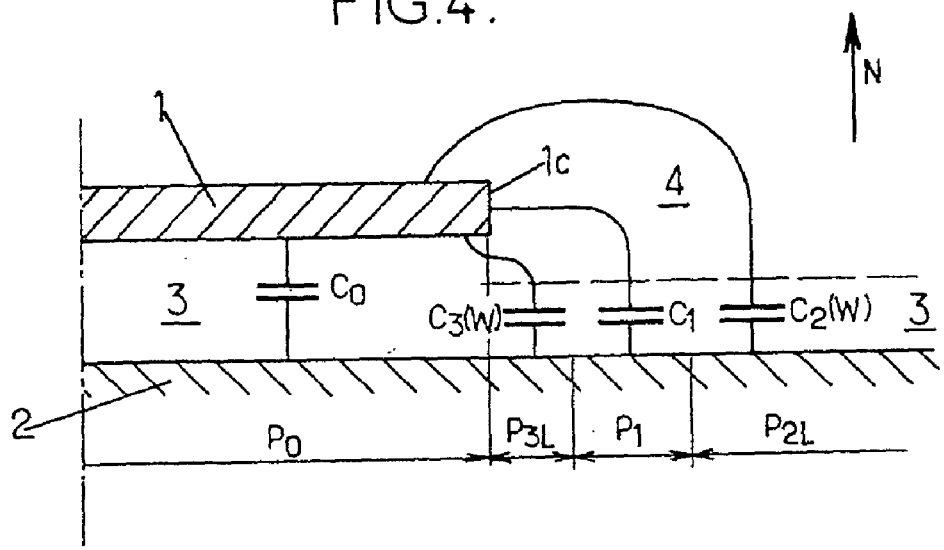
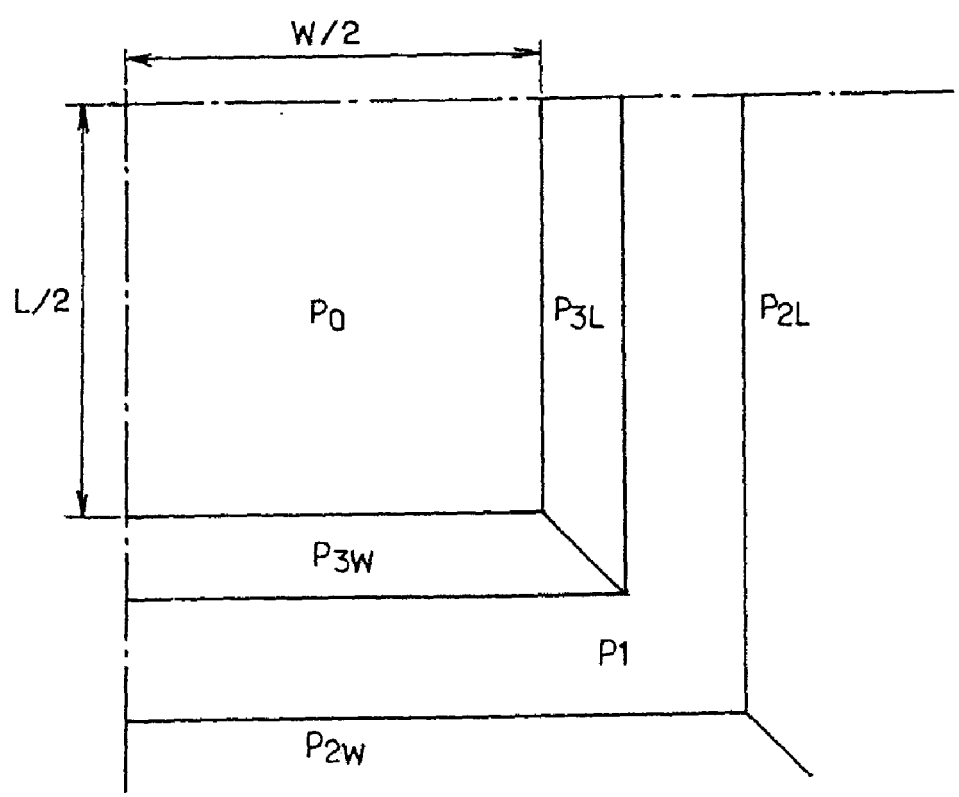
FIG.5.

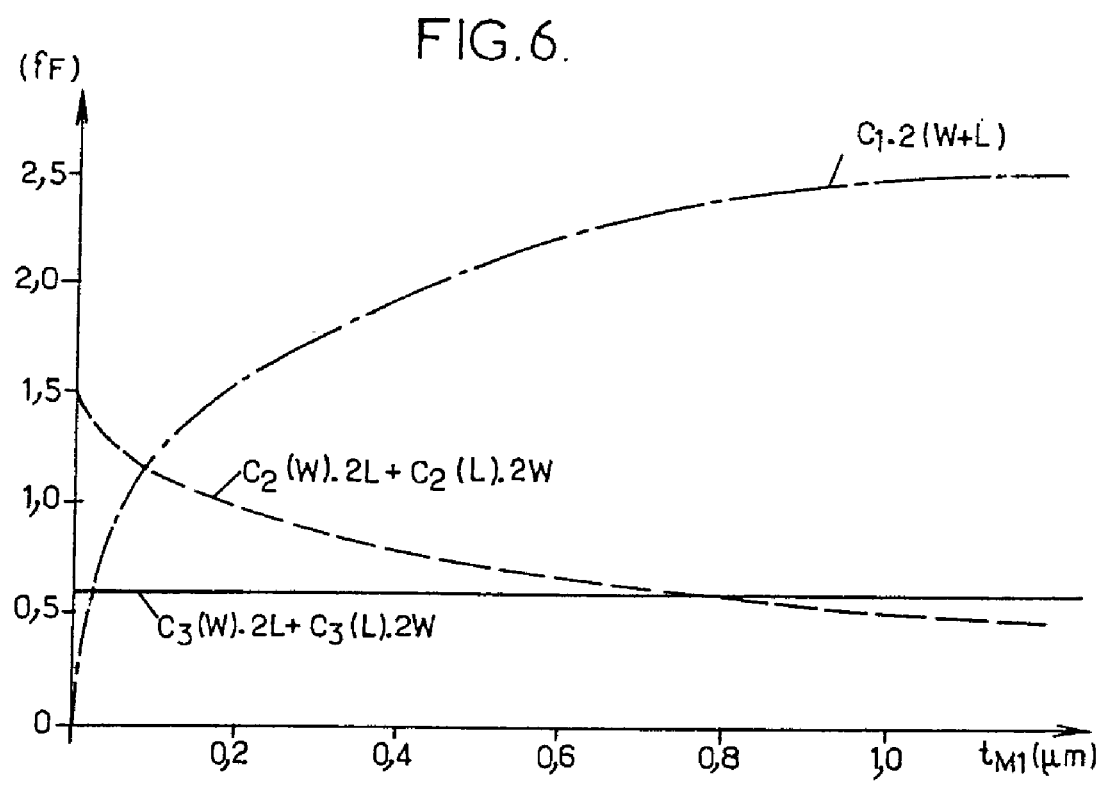

US 7,188,038 B2

METHOD OF DETERMINING AN ELECTRICAL CAPACITANCE OF A CIRCUIT COMPONENT AND METHOD OF DEFINING A DIMENSION OF SUCH A COMPONENT

TECHNICAL FIELD OF THE INVENTION

The present invention relates to electrical capacitance generally, and, more particularly, to methods of (i) determining the electrical capacitance of a circuit component, and (ii) defining a dimension of such a circuit component.

BACKGROUND OF THE INVENTION

There is a recurrent need to determine the electrostatic interaction capacitance between two conducting parts when designing integrated circuits. The determination is carried out in particular to characterize capacitors used in circuits, or to characterize electrostatic interactions between various conducting parts such as, for example, electrical signal transmission tracks. This is because such interactions introduce delays in the electrical operation of the circuit incorporating these conducting parts. In the case of electrical signal transmission tracks, these delays reduce the signal transmission rate.

A first method of determining such capacitances consists in solving the fundamental electrostatic equations known to those skilled in the art. These equations may especially be reduced to the Laplace equation relating to the electrostatic potential, combined with boundary conditions suitable for the conducting parts envisaged. However, an exact solution of the problem thus posed is possible only for simple geometrical configurations of the conducting parts, which in general do not correspond to actual configurations used in integrated circuits.

Methods for the approximate solution of the Laplace equation, especially by finite elements, have been developed which allow the electrostatic potential to be calculated at defined points in the vicinity of the conducting parts. An estimate of the capacitance between two conducting parts can therefore be easily deduced therefrom. In order for this estimate to be sufficiently accurate, such methods require the electrostatic potential to be calculated at a very large number of points. Consequently, they are tedious and lengthy, they require the use of computing stations of high computing power, and they are expensive in terms of computing time.

To reduce the amount of computing needed for finite element methods, it is common practice to make approximations and simplifications which impair the accuracy of the estimate obtained. These approximations especially comprise simplifications of the configuration of the conducting parts, such as, the fact of neglecting the thickness of conducting plates with respect to their length and their width. The estimate of the capacitance calculated in this way therefore often differs by 10%, or even 14%, from the actual capacitance, when the latter can, for example, be determined experimentally.

In general, the relative difference between the capacitance thus estimated and the actual capacitance of an integrated component increases when the size of said component decreases. This increase results especially from contributions neglected in the calculation of the capacitance, the magnitude of which increases relative to the contributions taken into account in the calculation, when the component becomes smaller. Such neglected contributions are, for example, associated with the edges of conducting parts. The increasing integration of electronic circuits fabricated at the present time consequently requires accurate methods of estimating capacitances.

Finally, for some geometrical configurations of the conducting parts, empirical methods have been developed over the last few decades, which are based on experimental results obtained for simplified geometries and which considerably reduce the amount of computing needed.

SUMMARY OF THE INVENTION

The present invention provides a method of estimating the capacitance between two conducting parts arranged in a particular configuration, which is rapid and requires neither approximations nor simplifications that substantially impair the accuracy of the estimate. In addition, the envisaged configuration includes two separate dielectrics placed near the conducting parts, which configuration corresponds to many actual electronic components.

The present invention relates to a circuit component comprising:

a first rectangular conducting plate (1), having a width W, a length L and a thickness $t_{M1}$;

a second conducting plate, parallel to the first plate and separated from the latter by a distance $t_{Ox}$, having a rectangular central part facing the first plate and a peripheral part surrounding said central part;

a first homogeneous dielectric, of relative dielectric permittivity $\epsilon_{Ox}$, placed between the first and second plates and having a thickness of $t_{Ox}$ between the two plates and of $t_{OxSt}$ in line with said peripheral part of the second plate, so that said first dielectric has a height step $t_{Ox}-t_{OxSt}$ around the perimeter of the first plate; and a second homogeneous dielectric, of relative dielectric permittivity $\epsilon_E$, surrounding the first plate and the first dielectric.

This configuration of conducting parts, combined with two dielectrics, corresponds to a frequently used integrated capacitor design compatible with MIM (Metal Insulator Metal) technology. The dimensions of the first conducting plate, which are less than those of the second conducting plate, reduce any dispersion in the actual capacitances of a series of capacitors caused by a misalignment of the two plates with respect to each other during fabrication of the capacitors.

Moreover, to increase the capacitance of a capacitor having such a structure without increasing its dimensions, the first dielectric may be chosen so as to possess a high relative dielectric permittivity, for example of around 23. The second dielectric may, for example, be silica, depending on the process for fabricating the electrical circuit that includes the capacitor. The relative dielectric permittivity of silica is around 4, lying between 3.7 and 4.2. Thus, thanks to the distinction between the two dielectrics in the method of the invention, the first dielectric may be especially chosen according to particular requirements, in particular those associated with the nature of the circuit component, while preserving a second dielectric suited to the technology for producing the electrical circuit.

The method of estimation according to the invention comprises the estimation of the capacitance of the compo nent as a sum of several terms including at least two terms of the form $C_0 \cdot W \cdot L$ and $C_1 \cdot 2(W+L)$, with $$C_0 = \frac{\varepsilon_0 \cdot \varepsilon_{0x}}{t_{0x}} \text{ and } C_1 = \frac{\varepsilon_0}{\pi} \cdot K \cdot \text{Ln}(a),$$

$\varepsilon_0$ being the dielectric permittivity of free space, $$K = \frac{\varepsilon_{0x} \cdot \varepsilon_E}{\varepsilon_{0x} - \left(\frac{(\varepsilon_E - \varepsilon_{0x})^2}{(\varepsilon_E + \varepsilon_{0x})} \cdot \frac{t_{0xSt}}{t_{0x}}\right)},$$

$$a = -1 + 2k^2 + 2k\sqrt{k^2 - 1} \text{ avec } k = 1 + \frac{t_{MI}}{t_{0x}}.$$

The inventors have in fact found that the sum $C_0 \cdot W \cdot L + C_1 \cdot 2(W+L)$ constitutes in many cases a sufficiently accurate estimate of the capacitance.

In the preferred implementation of the invention, the sum forming the estimate of the capacitance includes two additional terms, generally less than the above two terms. These two additional terms increase the accuracy of the estimate obtained. They are of the form $$[C_2(W) + C_3(W)] \cdot 2L \text{ and } [C_2(L) + C_3(L)] \cdot 2W,$$

with, for $x = W$ or $L$:

$$C_2(x) = \frac{\varepsilon_0}{\pi} \cdot K \cdot \text{Ln}\left(\frac{u(x)}{a}\right), \text{ and}$$

$$C_3(x) = \frac{\varepsilon_0 \cdot \varepsilon_{0x}}{\pi} \cdot [2 - \text{Ln}4 - \text{Ln}(1 - 2\exp(-2\theta(x)))],$$

ln denoting the natural logarithm,
the quantity $u(x)$ being an estimate of a solution of the equation $$\frac{\pi}{2} \frac{x}{t_{0x}} = -\frac{a+1}{\sqrt{a}} \cdot \text{Ln}\left(\frac{R(x)+1}{R(x)-1}\right) + \frac{a-1}{\sqrt{a}} \cdot \frac{R(x)}{(R(x))^2 - 1} + \text{Ln}\left(\frac{R(x)\sqrt{a}+1}{R(x)\sqrt{a}-1}\right)$$

with $$R(x) = \sqrt{\frac{u(x) - 1}{u(x) - a}},$$

exp denoting the exponential of base e, and $$\theta(x) = 1 + \pi \frac{x}{2t_{0x}}.$$

The two terms $[C_2(W)+C_3(W)] \cdot 2L$ and $[C_2(L)+C_3(L)] \cdot 2W$ are therefore added to the sum forming the estimate of the component's capacitance. Thus, according to the preferred implementation of the invention, the estimate of the capacitance may be written:

$$C = C_0 \cdot W \cdot L + C_1 \cdot 2(W+L) + [C_2(W) + C_3(W)] \cdot 2L + [C_2(L) + C_3(L)] \cdot 2W$$

Optionally, other terms may also be added thereto. One particular advantage of the method of the invention and of its preferred implementation lies in the ease of their programming, coupled with the fact that only simple equations are used to obtain the estimate of the capacitance. Standard computing instruments are therefore sufficient.

Preferably, the quantity $u(x)$ is obtained using an iterative method of approximate solution, applied to the equation:

$$\frac{\pi}{2} \frac{x}{t_{0x}} = -\frac{a+1}{\sqrt{a}} \cdot \text{Ln}\left(\frac{R(x)+1}{R(x)-1}\right) + \frac{a-1}{\sqrt{a}} \cdot \frac{R(x)}{(R(x))^2 - 1} + \text{Ln}\left(\frac{R(x)\sqrt{a}+1}{R(x)\sqrt{a}-1}\right)$$

with $$R(x) = \sqrt{\frac{u(x) - 1}{u(x) - a}}.$$

Such a method is, for example that called "Newton's method" or "method of tangents", known to those skilled in the art. The estimate of the capacitance C is then coupled analytically with the geometrical parameters of the first and second plates and with the relative dielectric permittivities of the first and second dielectrics, thereby allowing a particularly simple determination of the capacitance.

The invention also relates to a method of numerically simulating the electrical behaviour of a circuit, which uses at least one capacitance of a component of the circuit determined in the above manner. Apart from the case of a capacitor, such a capacitance may arise in many other components. Among these other components, mention may be made of cases in which the first and second conducting plates correspond to two portions of electrical signal transmission tracks, or else to components in which the second conducting plate corresponds to an electrically conducting substrate carrying the first and second dielectrics and the first conducting plate.

Optionally, the electrical component may furthermore include, in addition to the first and second conducting plates, a substantially plane electrically conducting substrate placed parallel to the two plates, to the rear of the second plate, the substrate comprising a rectangular central part facing the second plate and a peripheral part surrounding said central part, and in which the second dielectric is furthermore placed between the second conducting plate and the substrate. The method of the invention can then be used again to estimate the interaction capacitance between the second plate and the substrate, different from the capacitance between the two conducting plates.

The invention also relates to a method of determining the dimensions of a capacitor formed from two conducting plates and two dielectrics arranged in the manner described above. The permittivities $\varepsilon_{Ox}$, and $\varepsilon_E$ and the thicknesses $t_{Ox}$, $t_{M1}$ and $t_{OxSt}$ are fixed by the capacitor's fabrication process, whereas the width W is determined by the circuit designer. The operation of defining the dimensions of the capacitor then consists in determining the length L of the first plate in order to obtain a fixed capacitance $C_u$.

The method of determining the dimensions of the capacitor includes, just as in the method of estimation described above, the calculation of the quantities $C_0$ and $C_1$ defined above and comprises the calculation of a first approximate value $L_1$ of the length L as a sum of first terms divided by a sum of second terms, said first terms comprising $C_u$ and at least one term of the form $-2.C_1.W$ and said second terms comprising at least two terms of the form $C_0.W$ and $2.C_1$. The value of $L_1$ is thus given by the equation:

$$L_1 = \frac{C_u - 2 \cdot C_1 \cdot W}{C_0 \cdot W + 2C_1}.$$

Just as in the case of the preferred implementation of the method of estimation of the invention, the method of defining the dimensions may furthermore include the calculation of the quantities $C_2(W)$, $C_2(L_0)$, $C_3(W)$ and $C_3(L_0)$, $L_0$ being a defined initial value. Said first terms then furthermore include two terms of the form $-2.C_2(L_0).W$ and $-2.C_3(L_0).W$ and said second terms furthermore include two terms of the form $2.C_2(W)$ and $2.C_3(W)$. The first approximate value $L_1$ of the length L is then given by the equation:

$$L_1(L_0) = \frac{C_u - 2W \cdot (C_1 + C_2(L_0) + C_3(L_0))}{C_0 \cdot W + 2C_1 + 2(C_2(W) + C_3(W))}.$$

Optionally, a second approximate value $L_2$ of L may be obtained by applying the above formula to the first approximate value $L_1$. Thus the following expression is calculated:

$$L_2(L_1) = \frac{C_u - 2W \cdot (C_1 + C_2(L_1) + C_3(L_1))}{C_0 \cdot W + 2C_1 + 2(C_2(W) + C_3(W))}.$$

In the identical manner, successive iterations of the same formula, applied in succession to the approximate value resulting from the previous iteration, make it possible to obtain more and more accurate approximate values of L. The initial value $L_0$ may be taken to be equal to W.

Just as in the case of estimating the capacitance, the quantities u associated with the values of W, $L_0$, $L_1$, etc. may be obtained using an iterative method for obtaining an approximate solution of an equation, known to those skilled in the art. This iterative method may be again, for example, that called Newton's method.

Finally, the invention relates to a computer program comprising instructions for applying, when running the program in a computer, a method of estimating a capacitance, of simulating an electrical operation or of defining the dimensions of a capacitor as described above.

Before undertaking a DETAILED DESCRIPTION OF THE INVENTION, it may be advantageous to set forth a definition of certain words and phrases used throughout this patent document: the terms "include" and "comprise," as well as derivatives thereof, mean inclusion without limitation; the term "or," is inclusive, meaning and/or; the phrase "associated with," as well as derivatives thereof, may mean to include, be included within, interconnect with, contain, be contained within, connect to or with, coupled to or with, be communicable with, cooperate with, interleave, juxtapose, be proximate to, be bound to or with, have, have a property of, or the like; the term "memory" means any storage device, combination of storage devices, or part thereof whether centralized or distributed, whether locally or remotely; and the terms "controller," "processor" and "circuitry" mean any device, system or part thereof that controls at least one operation, such a device, system or part thereof may be implemented in hardware, firmware or software, or some combination of at least two of the same.

It should be noted that the functionality associated with any particular controller, processor or circuitry may be centralized or distributed, whether locally or remotely. In particular, a controller, processor or circuitry may comprise one or more data processors, and associated input/output devices and memory that execute one or more application programs and/or an operating system program.

Additional definitions for certain words and phrases are provided throughout this patent document, those of ordinary skill in the art should understand that in many, if not most instances, such definitions apply to prior uses, as well as future uses, of such defined words and phrases.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is made to the following descriptions taken in conjunction with the accompanying drawings, wherein like numbers designate like objects, and in which:

FIG. 4 illustrates partial capacitors associated with various terms of the estimate according to the invention of the capacitance of the capacitor of FIGS. 1 and 2;

FIG. 5 shows various regions of the lower plate of the capacitor of FIGS. 1 and 2;

FIG. 6 shows the variations of three terms of the estimate of the capacitance of the capacitor of FIGS. 1 and 2.

DETAILED DESCRIPTION

Figure 1:
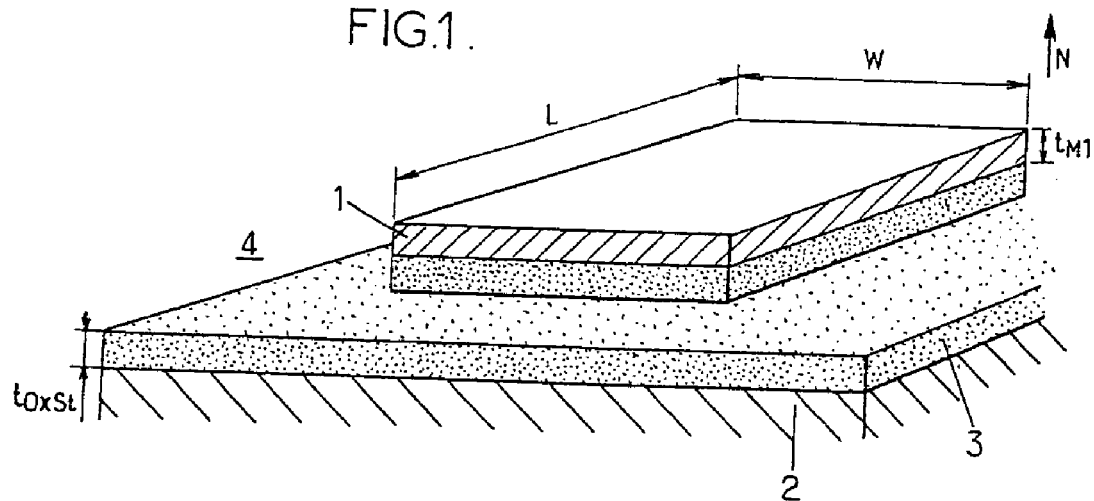
FIG. 1 is a perspective diagram of a capacitor to which the invention applies.

FIGS. 1 through 7, discussed below, and the various embodiments used to describe the principles of the present invention in this patent document, are by way of illustration only and should not be construed in any way to limit the scope of the invention. Those skilled in the art will understand that the principles of the present invention may be implemented in any suitably arranged system, as well as method of operating the same, for determining the electrical capacitance of a circuit component, and defining a dimension of such a circuit component.

In these figures, for the sake of clarity, the dimensions of the various parts of components shown are not in proportion with the actual dimensions. In all the figures, identical references correspond to similar elements. N denotes a direction perpendicular to the plates, directed upwards in the figures. The terms "above", "below", "on", "under", "upper" and "lower" used below refer to this orientation.

Embodiments of the invention will now be described more particularly within the context of a first example corresponding to the estimate of the capacitance of a parallel-faced capacitor having an approximate value of 2 femtofarads per square micron (2 fF/μm$^2$). Such a capacitor is formed from two plane rectangular metal plates arranged facing each other. The first plate 1, in the upper position in FIG. 1, has a thickness $t_{M1}$ of 0.18 microns (denoted hereinafter by μm), a width W of 3.5 μm and a length L of 138 μm. The second plate 2, in the lower position in FIG. 1, has for example a width of 5.9 μm and a length of 140.4 μm, which are parallel to the width W and to the length L of the plate 1, respectively. Thus, the plate 2 has a peripheral part 1.2 μm in width (denoted by ΔW in FIG. 3) which extends around a projection of the plate 1 on the plate 2 in the direction N. The two plates 1, 2 are made of copper or aluminium for example.

Figure 2:
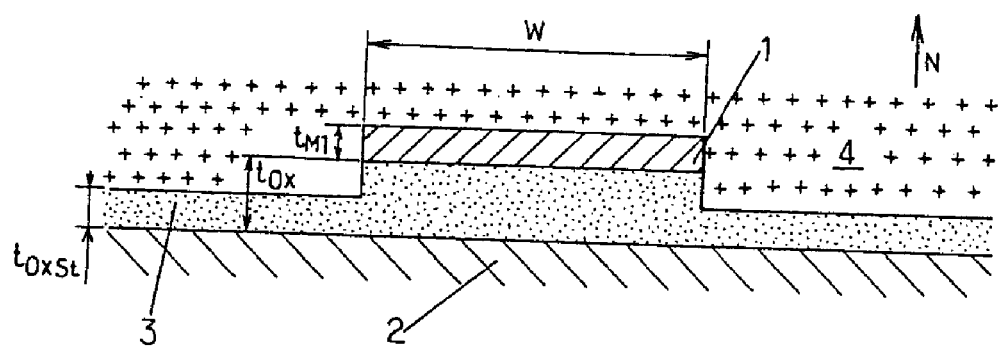
FIG. 2 is a sectional view of the capacitor of FIG. 1.

A first dielectric 3 covers the upper face of the plate 2 and is in contact with the plate 1, against the lower face of the latter. The dielectric 3 has a thickness $t_{Ox}$ of 0.032 μm between the plates 1 and 2, and a thickness $t_{OxSt}$ of 0.015 μm outside the inter-plate space. The dielectric 3 therefore has, on its upper face, a step of height $t_{Ox}-t_{OxSt}$ of 0.017 μm located in line with the perimeter of the plate 1. FIG. 2 is a sectional view of the capacitor indicating $t_{Ox}$ and $t_{OxSt}$. The dielectric 3 is, for example, tantalum oxide Ta$_2$O$_5$ with a relative dielectric permittivity $\epsilon_{Ox}$ of 7.25.

A second dielectric 4 is placed above the plate 1 and the dielectric 3 (see FIG. 2). It is composed of silica, for example, with a relative dielectric permittivity $\epsilon_E$ of 4.0.

Figure 3:
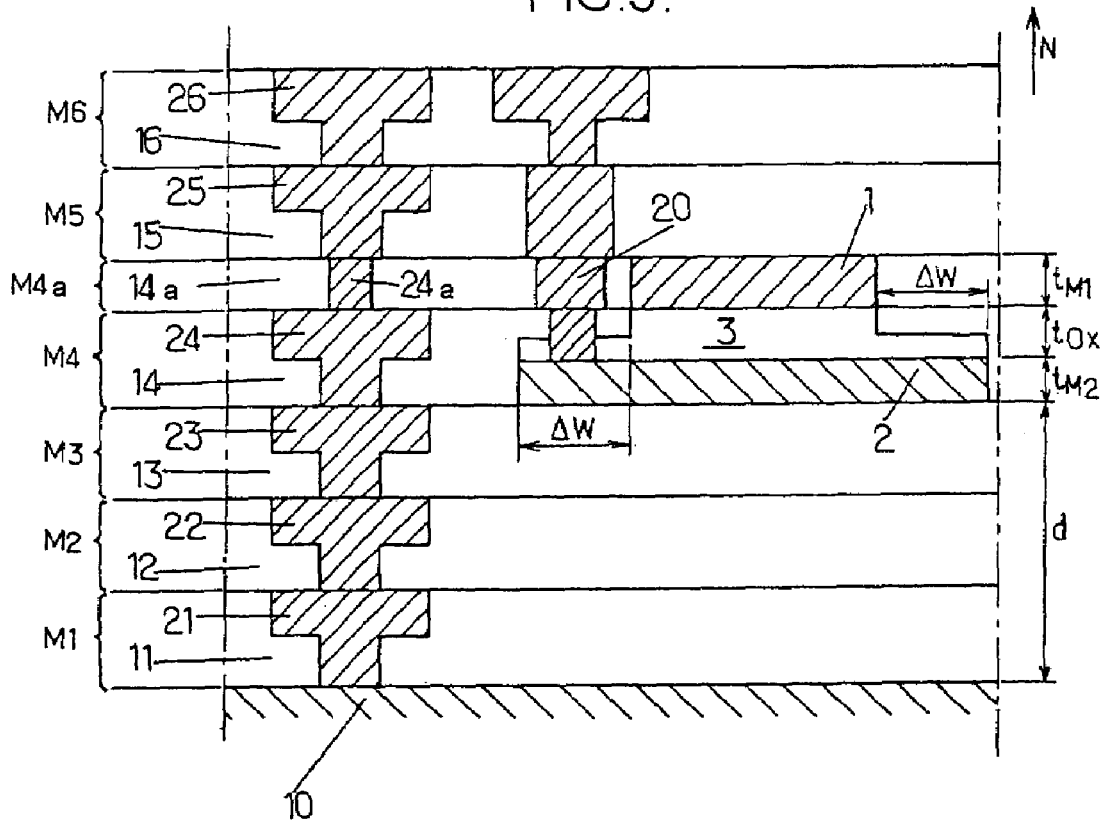
FIG. 3 is a sectional view of an electrical circuit incorporating the capacitor of FIGS. 1 and 2.

FIG. 3 shows a section through an integrated circuit having several metallization levels M1, M2, M3, M4, M4a, M5 and M6 placed above a conducting silicon substrate 10. M4a is an additional level especially provided for producing the plate 1. Each metallization level comprises a silica layer 11, 12, ..., 16 and 14a in which metal parts 21, 22, ..., 26 and 24a are formed. The layer 14 corresponds to the dielectric 4. The metal parts 21, 22, ..., 26 and 24a constitute electrical connections parallel to the substrate 10 or along the direction N. In the latter case, they are known as vias. The metallization levels M1, ..., M6 and M4a may be produced using the damascene method known to those skilled in the art.

The plate 2 is produced within the metallization level M4. The dielectric 3 is placed in a volume especially provided within the layer 14 of the level M4.

As illustrated in FIG. 3, the lateral extensions ΔW of the plate 2 relative to the plate 1 make it possible to provide vias 20 for contact with the plate 2, these being placed around the periphery of the upper face of the plate 2, without these vias coming into electrical contact with the plate 1. In addition, a misalignment of the metallization levels M4 and M4a with respect to each other, parallel to the surface of the substrate 10, due to insufficient control of the position of the lithography masks used in the production of these levels, slightly impairs the capacitance of the capacitor. The plate 1 therefore is still entirely opposite a part of the plate 2.

Using the above numerical values of the permittivities and thicknesses, and with $\epsilon_0$=8.854×10$^{-12}$ F/m for the dielectric permittivity of free space, the values of the following intermediate quantities are obtained using the formulae given below:

$$C_0 = \frac{\epsilon_0 \cdot \epsilon_{Ox}}{t_{Ox}} \qquad C_0 = 2{,}006 \cdot 10^{-3} \text{ F/m}^2$$

$$K = \frac{\epsilon_{Ox} \cdot \epsilon_E}{\epsilon_{Ox} - \left(\frac{(\epsilon_E - \epsilon_{Ox})^2}{(\epsilon_E + \epsilon_{Ox})} \cdot \frac{t_{OxSt}}{t_{Ox}}\right)} \qquad K = 3{,}771$$

$$k = 1 + \frac{t_{M1}}{t_{Ox}} \qquad k = 6{,}625$$

$$a = -1 + 2k^2 + 2k\sqrt{k^2-1} \qquad a = 173{,}6$$

$$C_1 = \frac{\epsilon_0}{\pi} \cdot K \cdot \text{Ln}(a) \qquad C_1 = 6{,}189 \cdot 10^{-11} \text{ fF/μm}$$

The first two terms of the estimate of the capacitance C are then: $C_0.W.L$=969.30 fF and $C_1.2(W+L)$=17.52 fF, and, by addition, a first estimate of the capacitance C is 986.82 fF.

This first estimate may be improved by taking account of the terms associated with $C_2$ and $C_3$. Transferring the above values of $t_{Ox}$ and a into the equation satisfied by u(x), the following numerical equation is obtained:

$$49087385 \cdot x =$$

$$-13{,}25 \cdot \text{Ln}\left(\frac{R(x)+1}{R(x)-1}\right) + 13{,}10 \cdot \frac{R(x)}{(R(x)^2-1)} + \text{Ln}\left(\frac{13{,}17 \cdot R(x)+1}{13{,}17 \cdot R(x)-1}\right)$$

with $$R(x) = \sqrt{\frac{u(x)-1}{u(x)-173{,}56}}.$$

By applying Newton's method for the approximate solution of this numerical equation, the following values of u are obtained for x=W=3.5 μm and x=L=138 μm, namely u(W)= 2708.57 and u(L)=90056.39. Thus:

$$C_2(W) = \frac{\epsilon_0}{\pi} \cdot K \cdot \ln\left(\frac{u(W)}{a}\right),$$

i.e $C_2(W)$=3.298×10$^{-11}$ F/m, and $$C_2(L) = \frac{\epsilon_0}{\pi} \cdot K \cdot \ln\left(\frac{u(L)}{a}\right),$$

i.e $C_2(L)$=7.503×10$^{11}$ F/m.

Putting x=W=3.5 μm and x=L=138 μm into the expression $$\theta(x) = 1 + \pi\frac{x}{2t_{Ox}},$$

we obtain θ (W)=172.81 and θ (L)=6777.76. The equation:

$$C_3(x) = \frac{\varepsilon_0 \cdot \varepsilon_{Ox}}{\pi} \cdot [2 - \text{Ln}4 - \text{Ln}(1 - 2\exp(-2\theta(x)))]$$

then gives $C_3(W) \approx C_3(L) \approx 1.254 \times 10^{-11}$ F/m. The two additional additive terms of the estimate of C are consequently: $[C_2(W)+C_3(W)].2L=12.56$ fF and $[C_2(L)+C_3(L)].2W=0.613$ fF. The complete estimate of C is then 999.98 fF.

The inventors have also proposed a physical interpretation of the various terms above in the estimate of the capacitance C, in the form of partial capacitors placed in parallel with respect to one another. These partial capacitors are identified in the manner described below and illustrated schematically in FIG. 4 which takes the plates 1 and 2 and the dielectrics 3 and 4 of FIG. 1 for one half of the capacitor shown.

The term $C_0.W.L$, which constitutes the main contribution to the estimate of C, corresponds to a first partial capacitor formed by the lower surface of the plate 1 and by the central part $P_0$ of the upper surface of the plate 2, facing the plate 1 along the direction N. This term corresponds to the expression for the capacitance of a plane capacitor with identical plates, known to those skilled in the art.

The other terms of the sum in the estimate of the capacitance C are contributions from the periphery of the capacitor, these being proportional to the elements having the length of this periphery.

The term $C_1.2(W+L)$ corresponds to a capacitance per unit length $C_1$ multiplied by the length of the perimeter of the plate 1. It may be combined with a partial capacitor, labelled $C_1$ in FIG. 4, formed by the sides $1c$ of the plate 1 that are parallel to the direction N and by a region $P_1$ of the peripheral part of the plate 2, shown in FIGS. 4 and 5. This is because electric field lines link these plate parts together, contributing to the overall capacitor effect.

The terms $[C_2(W)+C_3(W)].2L$ and $[C_2(L)+C_3(L)].2W$ correspond to contributions from the edges of the plate 1, taken in pairs along the length and along the width of the plate 1, respectively. They are thus proportional to 2L and 2W, respectively. $C_2(W).2L$ corresponds to a partial capacitor, formed, on the one hand, by a peripheral region of the upper face of the plate 1, along each edge of length L of the plate 1, and, on the other hand, by a peripheral region $P_{2L}$ of the upper face of the plate 2 (partial capacitor labelled $C_2(W)$ in FIG. 4; see also FIG. 5). The region $P_{2L}$ is located outside the region $P_1$.

The term $C_3(W).2L$ corresponds to a partial capacitor formed, on the one hand, by a peripheral region of the lower face of the plate 1, along an edge of length L of the plate 1, and, on the other hand, by a peripheral region $P_{3L}$ of the upper face of the plate 2 (partial capacitor labelled $C_3(W)$ in FIG. 4; see also FIG. 5). The region $P_{3L}$ is located between the regions $P_0$ and $P_1$.

These physical interpretations of the terms $C_2(W).2L$ and $C_3(W).2L$ may be transposed in order to interpret the terms $C_2(L).2W$ and $C_3(L).2W$ by introducing the regions $P_{2W}$ and $P_{3W}$ of the upper surface of the plate 2, as shown in FIG. 5.

When the size of the capacitor is reduced, corresponding to fabrication technologies according to increasing levels of integration, the various terms in the estimate of C appear in the following order of importance: $C_0.W.L>C_1.2(W+L)>C_2(W).2L$, $C_3(W).2L$, $C_2(L).2W$ and $C_3(L).2W$. This classification reveals the predominant contribution due to the thickness of the plate 1 relative to the respective peripheral contributions of the upper and lower faces of the plate 1. This is illustrated by FIG. 6 which shows the variations of the three terms $C_1.2(W+L)$, $C_2(W).2L+C_2(L).2W$ and $C_3(W).2L+C_3(L).2W$ when the thickness $t_{M1}$ of the plate 1 varies. The values of $t_{Ox}$, $t_{OxSt}$, W, L, $\epsilon_{Ox}$, $\epsilon_E$ corresponding to FIG. 6 are those mentioned above.

To obtain particularly accurate numerical simulations of the behaviour of the capacitor within the electrical circuit shown in FIG. 3, the interaction between the capacitor and the substrate 10 may be described by another capacitance, called the substrate interaction capacitance. To simplify matters, this substrate interaction capacitance takes into account only the effect of the substrate on the plate 2, closer to the substrate 10 than the plate 1. In FIG. 3, d represents the distance between the surface of the substrate 10 and the lower face of the plate 2, i.e. 5.32 μm in the example in question. ΔW represents the additional width portions of the plate 2 relative to the plate 1 in the plane of FIG. 3. Taking the dimensions mentioned above, the plate 2 has overlengths of the same magnitude relative to the plate 1 along the direction perpendicular to the plane of FIG. 3.

It is apparent that the principles and formulae presented above in relation to the two plates 1 and 2 may be transposed to the system formed by the plate 2 and the substrate 10. These principles and formulae make it possible to take into account, in the same way, two different dielectrics placed in the metallization levels M1 to M4 in a configuration similar to that of the above dielectrics 3 and 4.

A second illustrative example of the invention will now be described, this relating to the definition of a dimension of a parallel-faced capacitor whose capacitance per unit area is approximately 5 fF/μm$^2$. Such a capacitor possesses a structure similar to that shown in FIGS. 1 and 2, with the following numerical data: $t_{M1}$=0.21 μm; $t_{Ox}$=0.040 μm; $t_{OxSt}$=0.036 μm; $\epsilon_{Ox}$=23.0; $\epsilon_E$=4.0. The fabrication process used furthermore determines the width of the plate 1, namely W=3.5 μm. The process of defining a dimension of the capacitor consists in determining the length L of the plate 1 so that the interaction capacitance between the plates 1 and 2 has a value fixed by the designer of the electrical circuit incorporating the capacitor. To take an example, the desired capacitance is 1000 fF.

A first estimate of the length L can take into account only the capacitance terms associated with $C_0$ and $C_1$. In this case, the steps in the numerical estimate of L are the following calculation of $$C_0 = \frac{\varepsilon_0 \cdot \varepsilon_{Ox}}{t_{Ox}}: \text{i.e. } C_0 = 5.019 \times 10^{-3} \text{ F/m}^2;$$

calculation of $$K = \frac{\varepsilon_{Ox} \cdot \varepsilon_E}{\varepsilon_{Ox} - \left(\frac{(\varepsilon_E - \varepsilon_{Ox})^2}{(\varepsilon_E + \varepsilon_{Ox})} \cdot \frac{t_{OxSt}}{t_{Ox}}\right)}: \text{i.e. } K = 2.651;$$

calculation of $$k = 1 + \frac{t_{M1}}{t_{Ox}}: \text{i.e. } k = 6.25;$$

calculation of $a = -1 + 2k^2 + 2k\sqrt{k^2-1}$:

i.e. a=154.24;

calculation of $$C_1 = \frac{\varepsilon_0}{\pi} \cdot K \cdot \ln(a): \text{i.e. } C_2 = 1.156 \times 10^{-10} \text{ fF/m}.$$

The first estimate $L_1$ of the length $L_1$ is then:

$$L_1 = \frac{C_u - 2 \cdot C_1 \cdot W}{C_0 \cdot W + 2C_1}$$

i.e. $L_1 = 55.36$ μm.

This estimate $L_1$ is improved by furthermore taking into account the terms associated with $C_2$ and $C_3$ in the estimate of the capacitance of the capacitor. $C_2(W)$, $C_2(L_0)$, $C_3(W)$ and $C_3(L_0)$ are then calculated in the same way as in the first example. Taking as an initial value $L_0 = W = 3.5$ μm, we obtain: $C_2(W) = C_2(L_0) = 5.982 \times 10^{-11}$ F/m and $C_3(W) = C_3(L_0) = 3.978 \times 10^{-11}$ F/m. The first estimate $L_1$ of L is then:

$$L_1(L_0) = \frac{C_u - 2W \cdot (C_1 + C_2(L_0) + C_3(L_0))}{C_0 \cdot W + 2C_1 + 2(C_2(W) + C_3(W))} \text{ i.e. } L_1 = 54,714 \text{ μm}.$$

By iterating the application of this formula twice, we obtain $L_2(L_1) = 54.691$ μm, and likewise $L_3(L_2) = 54.691$ μm, which demonstrates the rapid convergence of the series of estimates of the length L thus obtained. The limit of this series gives the value of L to be adopted for fabrication of the capacitor, namely $L = 54.69$ μm.

The advantages and benefits of this method of determining the length of a capacitor will be obviously apparent to those skilled in the art, in particular as regards the simplicity of the calculations used and the accuracy of the result obtained.

The two examples presented above illustrate two separate aspects of the invention. The first aspect consists in estimating a capacitance from all the geometrical data and from the dielectric permittivities of the materials of the electronic component. The second aspect consists in determining one dimension of a capacitor so as to obtain the desired capacitance. These two aspects relate to the same invention, both being based on the same formulae used in two different ways by mathematical transformation.

The components in question in these two examples are capacitors, taken as an illustration. The invention may be applied in the same way to components of another type, the structure of which is compatible with the configuration of the model. An electrical signal transmission track, as shown in FIG. 7, constitutes an alternative example.

Figure 7:
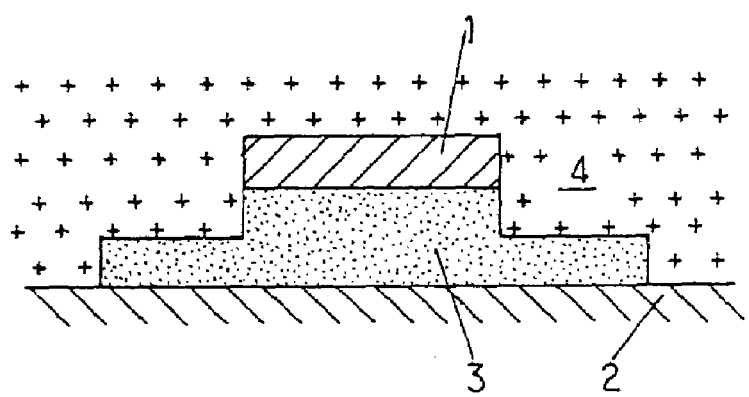
FIG. 7 is a sectional view of an electrical signal transmission track to which the invention applies.

In FIG. 7, a metal track 1, of parallelepipedal general shape and having a great length perpendicular to the plane of the figure, is placed within a layer of a dielectric 4 above the surface of a conducting substrate 2. The material of the track 1 is, for example, copper and the substrate 2 is, for example, made of silicon. The dielectric 4 is, for example, silica. In a manner known per se, the electrostatic interactions between the track 1 and the substrate 2 are of the capacitive type and depend principally on the dielectric permittivity of the dielectric 3 placed between the track 1 and the substrate 2. To reduce these interactions, the dielectric 3 is chosen so as to have a particularly low dielectric permittivity. To do this, it may be an organic material, for example of the polymer type, or a porous material. Optionally, the volume corresponding to the dielectric 3 may be left as a void, using a fabrication process adapted to the circuit thus designed. In one particularly used configuration, the dielectric 3 has two parallel faces over its entire extent parallel to the substrate 2 so that $t_{Ox} = t_{OxSt}$.

The latter example again illustrates the particular benefit of the invention, which takes into account two different adjacent dielectric media 3 and 4, the respective electrostatic behaviour of which, characterized by their dielectric permittivities, may be very different.

Although the present invention has been described in detail, those skilled in the art should understand that they can make various changes, substitutions and alterations herein without departing from the spirit and scope of the invention in its broadest form.

What is claimed is:

1. Method of estimating an electrical capacitance of a circuit component comprising:
  a first rectangular conducting plate, having a width W, a length L and a thickness $t_{M1}$;
  a second conducting plate, parallel to the first plate and separated from the latter by a distance $t_{Ox}$, having a rectangular central part facing the first plate and a peripheral part surrounding said central part;
  a first homogeneous dielectric, of relative dielectric permittivity $\epsilon_{Ox}$, placed between the first and second plates and having a thickness of $t_{Ox}$ between the two plates and of $t_{OxSt}$ in line with said peripheral part of the second plate, so that said first dielectric has a height step $t_{Ox} - t_{OxSt}$ around the perimeter of the first plate; and
  a second homogeneous dielectric, of relative dielectric permittivity $\epsilon_E$, surrounding the first plate and the first dielectric,
  the method comprising the estimation of the capacitance of the component as a sum of several terms including at least two terms of the form $C_0 \cdot W \cdot L$ and $C_1 \cdot 2(W+L)$, with $$C_0 = \frac{\epsilon_0 \cdot \epsilon_{Ox}}{t_{Ox}} \text{ and } C_1 = \frac{\epsilon_0}{\pi} \cdot K \cdot \text{Ln}(a),$$

$\epsilon_0$ being the dielectric permittivity of free space, $$K = \frac{\epsilon_{Ox} \cdot \epsilon_E}{\epsilon_{Ox} - \left(\frac{(\epsilon_E - \epsilon_{Ox})^2}{(\epsilon_E + \epsilon_{Ox})} \cdot \frac{t_{OxSt}}{t_{Ox}}\right)},$$

$$a = -1 + 2k^2 + 2k\sqrt{k^2 - 1} \text{ with } k = 1 + \frac{t_{M1}}{t_{Ox}}.$$

2. Method according to claim 1, wherein the terms of the sum furthermore include two terms of the form $[C_2(W) + C_3(W)] \cdot 2L$ and $[C_2(L) + C_3(L)] \cdot 2W$, with, for $x = W$ or L:

$$C_2(x) = \frac{\epsilon_0}{\pi} \cdot K \cdot \text{Ln}\left(\frac{u(x)}{a}\right) \text{ and}$$

$$C_3(x) = \frac{\epsilon_0 \cdot \epsilon_{Ox}}{\pi} \cdot [2 - \text{Ln}4 - \text{Ln}(1 - 2\exp(-2\theta(x)))],$$

the quantity $u(x)$ being an estimate of a solution of the equation $$\frac{\pi}{2} \frac{x}{t_{Ox}} = -\frac{a+1}{\sqrt{a}} \ln\left(\frac{R(x)+1}{R(x)-1}\right) + \frac{a-1}{\sqrt{a}} \frac{R(x)}{(R(x)^2 - 1)} + \ln\left(\frac{R(x)\sqrt{a}+1}{R(x)\sqrt{a}-1}\right)$$

with $$R(x) = \sqrt{\frac{u(x)-1}{u(x)-a}},$$

and $$\theta(x) = 1 + \pi \frac{x}{2t_{0x}}.$$

3. Method of determining a dimension of a capacitor of electrical capacitance $C_u$ comprising:
- a first rectangular conducting plate, having a width W, a length L and a thickness $t_{M1}$;
- a second conducting plate, parallel to the first plate and separated from the latter by a distance $t_{Ox}$, having a rectangular central part facing the first plate and a peripheral part surrounding said central part;
- a first homogeneous dielectric, of relative dielectric permittivity $\epsilon_{Ox}$, placed between the first and second plates and having a thickness of $t_{Ox}$ between the two plates and of $t_{OxSt}$ in line with said peripheral part of the second plate, so that said first dielectric has a height step $t_{Ox}-t_{OxSt}$ around the perimeter of the first plate; and
- a second homogeneous dielectric, of relative dielectric permittivity $\epsilon_E$, surrounding the first plate and the first dielectric, the method comprising the calculation of a first approximate value $L_1$ of the length L as a sum of first terms including $C_u$ and at least one term of the form $-2 \cdot C_1 \cdot W$ divided by a sum of second terms including at least two terms of the form $C_0 \cdot W$ and $2 \cdot C_1$, with $$C_0 = \frac{\varepsilon_0 \cdot \varepsilon_{0x}}{t_{0x}} \text{ and } C_1 = \frac{\varepsilon_0}{\pi} \cdot K \cdot \ln(a),$$

$\epsilon_0$ being the dielectric permittivity of free space, $$K = \frac{\varepsilon_{0x} \cdot \varepsilon_E}{\varepsilon_{0x} - \left( \frac{(\varepsilon_E - \varepsilon_{0x})^2}{(\varepsilon_E + \varepsilon_{0x})} \cdot \frac{t_{0xSt}}{t_{0x}} \right)},$$

$a = -1 + 2k^2 + 2k\sqrt{k^2-1}$ with $$k = 1 + \frac{t_{M1}}{t_{0x}}.$$

4. Method according to claim 3, wherein said first terms furthermore include two terms of the form $-2 \cdot C_2(L_0) \cdot W$ and $-2 \cdot C_3(L_0) \cdot W$, $L_0$ being a defined initial value and wherein said second terms furthermore include two terms of the form $2 \cdot C_2(W)$ and $2 \cdot C_3(W)$, with for $$x = W \text{ or } L_0: C_2(x) = \frac{\varepsilon_0}{\pi} \cdot K \cdot \ln\left(\frac{u(x)}{a}\right), \text{ and}$$

-continued $$C_3(x) = \frac{\varepsilon_0 \cdot \varepsilon_{0x}}{\pi} \cdot [2 - \text{Ln}4 - \text{Ln}(1 - 2\exp(-2\theta(x)))],$$

The quantity u(x) being an estimate of a solution of the equation:

$$\frac{\pi}{2} \frac{x}{t_{0x}} = -\frac{a+1}{\sqrt{a}} \ln\left(\frac{R(x)+1}{R(x)-1}\right) + \frac{a-1}{\sqrt{a}} \frac{R(x)}{(R(x)^2-1)} + \ln\left(\frac{R(x)\sqrt{a}+1}{R(x)\sqrt{a}-1}\right)$$

with $$R(x) = \sqrt{\frac{u(x)-1}{u(x)-a}},$$

and $$\theta(x) = 1 + \pi \frac{x}{2t_{0x}}.$$

5. A method of estimating an electrical capacitance of a circuit component comprising,
- a rectangular first conducting plate,
- a second conducting plate parallel to the first plate, having a rectangular central part facing the first plate and a peripheral part surrounding said central part,
- a first homogeneous dielectric placed between the first and second conducting plates, and
- a second homogeneous dielectric surrounding the first conducting plate and the first dielectric, the method comprising the steps of:
- estimating a capacitance of a first partial capacitor formed by the lower surface of the first conducting plate and the central part of the upper surface of the second conducting plate;
- estimating a capacitance of a second partial capacitor formed by the sides of the first conducting plate and the peripheral part of the upper surface of the second conducting plate; and
- determining an estimated capacitance of the circuit component by summing the estimated capacitances of the first and second partial capacitors.

6. The method of claim 5, further comprising the steps of:
- estimating a capacitance of a third partial capacitor formed by a peripheral region of the upper face of the first conducting plate and the peripheral part of the upper surface of the second conducting plate; and
- estimating a capacitance of a fourth partial capacitor formed by a peripheral region of the lower face of the first conducting plate and the peripheral part of the upper surface of the second conducting plate, wherein the step of determining an estimated capacitance of the circuit component further comprises summing the estimated capacitances of the third and fourth capacitances.

7. The method of claim 5, wherein the circuit component is a capacitor, and wherein a first plate of the capacitor comprises the first conducting plate of the circuit component and a second plate of the capacitor comprises the second conducting plate of the circuit component.

8. The method of claim 5, wherein a first electrical signal transmission tracks comprises the first conducting plate of the circuit component and a second electrical signal transmission tracks comprises the second conducting plate of the circuit component.

9. The method of claim 5, wherein a conducting substrate carrying the first and second dielectrics and the first conducting plate comprises the second plate of the circuit component.

10. A computer readable medium having stored thereon computer executable instructions for performing the method of claim 5.

11. The method of claim 5, wherein
the first conducting plate has a width W, a length L and a thickness $t_{M1}$,
the second conducting plate is separated from the first conducting plate by a distance $t_{Ox}$,
the first dielectric has a relative dielectric permittivity $\epsilon_{Ox}$ and a thickness of $t_{Ox}$ between the two conducting plates and of $t_{OxSt}$ in line with the peripheral part of the second conducting plate, and
the second dielectric has a relative dielectric permittivity $\epsilon_E$,
and wherein,
the step of estimating a capacitance of a first partial capacitor comprises calculating $C_0 \cdot W \cdot L$,
the step of estimating a capacitance of a second partial capacitor comprises calculating $C_1 \cdot 2(W+L)$, with $$C_0 = \frac{\varepsilon_0 \cdot \varepsilon_{Ox}}{t_{Ox}},$$

$$C_1 = \frac{\varepsilon_0}{\pi} \cdot K \cdot \text{Ln}(a),$$

Ln denoting the natural logarithm,
$\epsilon_0$ denoting the dielectric permittivity of free space, $$K = \frac{\varepsilon_{Ox} \cdot \varepsilon_E}{\varepsilon_{Ox} - \left(\frac{(\varepsilon_E - \varepsilon_{Ox})^2}{\varepsilon_E + \varepsilon_{Ox}} \cdot \frac{t_{OxSt}}{t_{Ox}}\right)}, \text{ and}$$

$$a = -1 + 2k^2 + 2k\sqrt{k^2 - 1} \text{ with } k = 1 + \frac{t_{M1}}{t_{Ox}}.$$

12. The method of claim 6, wherein
the first conducting plate has a width W, a length L and a thickness $t_{M1}$,
the second conducting plate is separated from the first conducting plate by a distance $t_{Ox}$,
the first dielectric has a relative dielectric permittivity $\epsilon_{Ox}$ and a thickness of $t_{Ox}$ between the two conducting plates and of $t_{OxSt}$ in line with the peripheral part of the second conducting plate, and
the second dielectric has a relative dielectric permittivity $\epsilon_E$,
and wherein,
the step of estimating a capacitance of a first partial capacitor comprises calculating $C_0 \cdot W \cdot L$,
the step of estimating a capacitance of a second partial capacitor comprises calculating $C_1 \cdot 2(W+L)$,
the step of estimating a capacitance of a third partial capacitor comprises calculating $[C_2(W)+C_3(W)] \cdot 2L$,
the step of estimating a capacitance of a fourth partial capacitor comprises calculating $[C_2(L)+C_3(L)] \cdot 2W$, with $$C_0 = \frac{\varepsilon_0 \cdot \varepsilon_{Ox}}{t_{Ox}},$$

$$C_1 = \frac{\varepsilon_0}{\pi} \cdot K \cdot \text{Ln}(a),$$

$$C_2(x) = \frac{\varepsilon_0}{\pi} \cdot K \cdot \text{Ln}\left(\frac{u(x)}{a}\right),$$

$$C_3(x) = \frac{\varepsilon_0 \cdot \varepsilon_{Ox}}{\pi} \cdot [2 - Ln4 - \text{Ln}(1 - 2\exp(-2\theta(x)))],$$

Ln denoting the natural logarithm,
$\epsilon_0$ denoting the dielectric permittivity of free space, $$K = \frac{\varepsilon_{Ox} \cdot \varepsilon_E}{\varepsilon_{Ox} - \left(\frac{(\varepsilon_E - \varepsilon_{Ox})^2}{\varepsilon_E + \varepsilon_{Ox}} \cdot \frac{t_{OxSt}}{t_{Ox}}\right)},$$

$$a = -1 + 2k^2 + 2k\sqrt{k^2 - 1} \text{ with } k = 1 + \frac{t_{M1}}{t_{Ox}},$$

$$\theta(x) = 1 + \pi \frac{x}{2t_{Ox}}, \text{ and}$$

u(x) being an estimate of a solution of the equation $$\frac{\pi}{2} \frac{x}{t_{Ox}} = -\frac{a+1}{\sqrt{a}} \ln\left(\frac{R(x)+1}{R(x)-1}\right) + \frac{a-1}{\sqrt{a}} \frac{R(x)}{(R(x))^2 - 1} + \ln\left(\frac{R(x)\sqrt{a}+1}{R(x)\sqrt{a}-1}\right) \text{ with}$$

$$R(x) = \sqrt{\frac{u(x)-1}{u(x)-a}}.$$

13. The method of claim 12, wherein the quantity u(x) is obtained using an iterative method of approximate solution.

14. A method of estimating a dimension of a capacitor having a desired electrical capacitance, the capacitor comprising,
a rectangular first conducting plate, having a width,
a second conducting plate parallel to the first plate, having a rectangular central part facing the first plate and a peripheral part surrounding said central part,
a first homogeneous dielectric placed between the first and second conducting plates, and
a second homogeneous dielectric surrounding the first conducting plate and the first dielectric,
the method comprising the steps of:
estimating a capacitance per unit of area of a first partial capacitor formed by the lower surface of the first conducting plate and the central part of the upper surface of the second conducting plate;
estimating a capacitance per unit of length of a second partial capacitor formed by the sides of the first conducting plate and the peripheral part of the upper surface of the second conducting plate; and
determining an estimated length of the first conducting plate, comprising calculating a function of the desired electrical capacitance, the estimated capacitance per unit of area of the first capacitor, the estimated capacitance per unit of length of the second partial capacitor, and the width of the first conducting plate.

15. The method of claim 14, further comprising the steps of:
estimating a capacitance per unit of length of a third partial capacitor formed by a peripheral region of the upper face of the first conducting plate and the peripheral part of the upper surface of the second conducting plate;

estimating a capacitance per unit of length of a fourth partial capacitor formed by a peripheral region of the lower face of the first conducting plate and the peripheral part of the upper surface of the second conducting plate;

selecting an initial estimated length of the first conducting plate; and determining an estimated length of the first conducting plate, comprising calculating a function of the desired electrical capacitance, the estimated capacitance per unit of area of the first capacitor, the estimated capacitances per unit of length of the second, third and fourth partial capacitors, the width of the first plate, and the initial estimated length of the first conducting plate.

16. The method of claim 15, wherein the step of determining an estimated length of the first conducting plate is performed iteratively until a desired degree of convergence of the estimated length of the first conducting plate is obtained, and wherein, after the first iteration, the step of determining an estimated length of the first conducting plate comprises calculating a function of the desired electrical capacitance, the estimated capacitance per unit of area of the first capacitor, the estimated capacitances per unit of length of the second, third and fourth partial capacitors, the width of the first plate, and the estimated length of the first conducting plate determined in the previous iteration.

17. The method of claim 16, wherein the initial estimated length of the first conducting plate is selected equal to the width of the first conducting plate.

18. The method of claim 14, wherein the first conducting plate has a width W and a thickness $t_{M1}$, the second conducting plate is separated from the first conducting plate by a distance $t_{Ox}$, the first dielectric has a relative dielectric permittivity $\epsilon_{Ox}$ and a thickness of $t_{Ox}$ between the two conducting plates and of $t_{OxSt}$ in line with the peripheral part of the second conducting plate, and the second dielectric has a relative dielectric permittivity 6E, and wherein, the step of estimating a capacitance per unit of area of a first partial capacitor comprises calculating $$C_0 = \frac{\varepsilon_0 \cdot \varepsilon_{Ox}}{t_{Ox}},$$

the step of estimating a capacitance per unit of area of a second partial capacitor comprises calculating $$C_1 = \frac{\varepsilon_0}{\pi} \cdot K \cdot \text{Ln}(a),$$

the step of determining an estimated length of the first conducting plate comprising calculating $$\frac{C_u - 2 \cdot C_1 \cdot W}{C_0 \cdot W + 2C_1},$$

with

Ln denoting the natural logarithm, $\epsilon_0$ denoting the dielectric permittivity of free space, $$K = \frac{\varepsilon_{Ox} \cdot \varepsilon_E}{\varepsilon_{Ox} - \left(\frac{(\varepsilon_E - \varepsilon_{Ox})^2}{(\varepsilon_E - \varepsilon_{Ox})} \cdot \frac{t_{OxSt}}{t_{Ox}}\right)}, \text{ and}$$

$$a = -1 + 2k^2 + 2k\sqrt{k^2 - 1} \text{ with } k = 1 + \frac{t_{M1}}{t_{Ox}}.$$

19. The method of claim 14, wherein the first conducting plate has a width W and a thickness $t_{M1}$, the second conducting plate is separated from the first conducting plate by a distance $t_{Ox}$, the first dielectric has a relative dielectric permittivity $\epsilon_{Ox}$ and a thickness of $t_{Ox}$ between the two conducting plates and of $t_{OxSt}$ in line with the peripheral part of the second conducting plate, and the second dielectric has a relative dielectric permittivity $\epsilon_E$, and wherein, the step of estimating a capacitance per unit of area of a first partial capacitor comprises calculating $$C_0 = \frac{\varepsilon_0 \cdot \varepsilon_{Ox}}{t_{Ox}},$$

the step of estimating a capacitance per unit of area of a second partial capacitor comprises calculating $$C_1 = \frac{\varepsilon_0}{\pi} \cdot K \cdot \text{Ln}(a),$$

the step of estimating a capacitance per unit of area of a third partial capacitor comprises calculating $$C_2(x) = \frac{\varepsilon_0}{\pi} \cdot K \cdot \text{Ln}\left(\frac{u(x)}{a}\right),$$

the step of estimating a capacitance per unit of area of a third partial capacitor comprises calculating $$C_3(x) = \frac{\varepsilon_0 \cdot \varepsilon_{Ox}}{\pi} \cdot [2 - Ln4 - \text{Ln}(1 - 2\exp(-2\theta(x)))],$$

the step of determining an estimated length of the first conducting plate comprises calculating $$\frac{C_u - 2W \cdot (C_1 + C_2(L_0) + C_3(L_0))}{C_0 \cdot W + 2C_1 + 2(C_2(W) + C_3(W))},$$

with $L_0$ denoting the initial estimated length of the first conducting plate,

Ln denoting the natural logarithm, $\epsilon_0$ denoting the dielectric permittivity of free space, $$K = \frac{\varepsilon_{Ox} \cdot \varepsilon_E}{\varepsilon_{Ox} - \left(\frac{(\varepsilon_E - \varepsilon_{Ox})^2}{(\varepsilon_E + \varepsilon_{Ox})} \cdot \frac{t_{OxSt}}{t_{Ox}}\right)},$$

$$a = -1 + 2k^2 + 2k\sqrt{k^2 - 1} \text{ with } k = 1 + \frac{t_{MI}}{t_{Ox}},$$

$$\theta(x) = 1 + \pi \frac{x}{2 t_{Ox}}, \text{ and}$$

u(x) being an estimate of a solution of the equation $$\frac{\pi}{2} \frac{x}{t_{Ox}} = -\frac{a+1}{\sqrt{a}} \ln\left(\frac{R(x)+1}{R(x)-1}\right) + \frac{a-1}{\sqrt{a}} \frac{R(x)}{(R(x)^2 - 1)} + \ln\left(\frac{R(x)\sqrt{a}+1}{R(x)\sqrt{a}-1}\right) \text{ with}$$

$$R(x) = \sqrt{\frac{u(x)-1}{u(x)-a}}.$$

20. The method of claim 19, wherein the quantity u(x) is obtained using an iterative method of approximate solution.

21. The method of claim 20, wherein the step of determining an estimated length of the first conducting plate is performed iteratively until a desired degree of convergence of the estimated length of the first conducting plate is obtained, and wherein, after the first iteration, the step of determining an estimated length of the first plate comprises calculating $$\frac{C_u - 2W \cdot (C_1 + C_2(L_{i-1}) + C_3(L_{i-1}))}{C_0 \cdot W + 2C_1 + 2(C_2(W) + C_3(W))},$$

with $L_{i-1}$ denoting estimated length of the first conducting plate determined in the previous iteration.

22. A computer readable medium having stored thereon computer executable instructions for performing the method of claim 14.

23. A method of simulating the electrical behavior of an electronic circuit comprising a circuit component, the circuit component comprising
a first rectangular conducting plate,
a second conducting plate parallel to the first plate, having a rectangular central part facing the first conducting plate and a peripheral part surrounding said central part,
a first homogeneous dielectric placed between the first and second conducting plates, and
a second homogeneous dielectric surrounding the first conducting plate and the first dielectric,
the method comprising the steps of:
estimating a capacitance of a first partial capacitor formed by the lower surface of the first conducting plate and the central part of the upper surface of the second conducting plate;
estimating a capacitance of a second partial capacitor formed by the sides of the first conducting plate and the peripheral part of the upper surface of the second conducting plate; and
determining an estimated capacitance of the circuit component by summing the estimated capacitances of the first and second partial capacitors.

24. The method of claim 23, further comprising the steps of:
estimating a capacitance of a third partial capacitor formed by a peripheral region of the upper face of the first conducting plate and the peripheral part of the upper surface of the second conducting plate; and
estimating a capacitance of a fourth partial capacitor formed by a peripheral region of the lower face of the first conducting plate and the peripheral part of the upper surface of the second conducting plate,
wherein the step of determining an estimated capacitance of the circuit component further comprises summing the estimated capacitances of the third and fourth capacitances.

25. The method of claim 23, wherein the electronic circuit further comprises a conducting substrate parallel to the second conducting plate and wherein the second dielectric is further placed between the second conducting plate and the conducting substrate, the method further comprising the steps of:
estimating a capacitance of a third partial capacitor formed by the lower surface of the second conducting plate and the central part of the upper surface of the conducting substrate;
estimating a capacitance of a fourth partial capacitor formed by the sides of the second conducting plate and the peripheral part of the upper surface of the conducting substrate; and
determining an estimated substrate interaction capacitance between the circuit component and the conducting substrate by summing the estimated capacitances of the third and fourth partial capacitors.

26. The method of claim 25, further comprising the steps of:
estimating a capacitance of a fifth partial capacitor formed by a peripheral region of the upper face of the second conducting plate and the peripheral part of the upper surface of the conducting substrate; and
estimating a capacitance of a sixth partial capacitor formed by a peripheral region of the lower face of the second conducting plate and the peripheral part of the upper surface of the conducting substrate,
wherein the step of determining an substrate interaction capacitance between the circuit component and the conducting substrate further comprises summing the estimated capacitances of the fifth and sixth capacitances.

27. The method of claim 23, wherein the electronic circuit further comprises
a conducting substrate parallel to the second conducting plate,
a third homogeneous dielectric placed between the second conducting plate and the conducting substrate, and
a fourth homogeneous dielectric surrounding the second conducting plate and the first dielectric,
the method further comprising the steps of:
estimating a capacitance of a third partial capacitor formed by the lower surface of the second conducting plate and the central part of the upper surface of the conducting substrate;
estimating a capacitance of a fourth partial capacitor formed by the sides of the second conducting plate and the peripheral part of the upper surface of the conducting substrate; and
determining an estimated substrate interaction capacitance between the circuit component and the con ducting substrate by summing the estimated capacitances of the third and fourth partial capacitors.

28. The method of claim 27, further comprising the steps of:

estimating a capacitance of a fifth partial capacitor formed by a peripheral region of the upper face of the second conducting plate and the peripheral part of the upper surface of the conducting substrate; and estimating a capacitance of a sixth partial capacitor formed by a peripheral region of the lower face of the second conducting plate and the peripheral part of the upper surface of the conducting substrate, wherein the step of determining an substrate interaction capacitance between the circuit component and the conducting substrate further comprises summing the estimated capacitances of the fifth and sixth capacitances.

* * * * *

UNITED STATES PATENT AND TRADEMARK OFFICE
CERTIFICATE OF CORRECTION

PATENT NO. : 7,188,038 B2
APPLICATION NO. : 10/669083
DATED : March 6, 2007
INVENTOR(S) : Eric Picollet and Michael Minondo It is certified that error appears in the above-identified patent and that said Letters Patent is hereby corrected as shown below:

Column 12, line 30, delete "the estimation of the capacitance of the component as" and insert --: calculating--;

Column 12, line 46, after the equation delete "." and insert --; and storing the calculated sum as an estimated capacitance of the component.--;

Column 13, line 33, delete "the calculation of a first approximate value $L_1$ of the length L as" and insert --: calculating--;

Column 13, line 55, after the equation delete "." and insert --; and storing the calculated sum as a first approximate value $L_1$ of the length L.--;

Column 14, line 46, delete "and" after "plate;";

Column 14, line 47, delete "determining an estimated capacitance of the circuit component by";

Column 14, line 49, after the term "capacitors" delete "." and insert --; and storing the sum as an estimated capacitance of the circuit component.--;

Column 16, line 56, delete "and";

Column 16, line 57, delete "determining an estimated length of the first conducting plate, comprising";

Column 16, line 63, delete "." after the term "plate" and insert --; and storing a result of the calculated function as an estimated length of the first conducting plate.--

Column 17, line 41, delete "6E" and replace with --$\varepsilon_E$--;

Column 19, line 60, delete "and";

UNITED STATES PATENT AND TRADEMARK OFFICE
CERTIFICATE OF CORRECTION

PATENT NO. : 7,188,038 B2
APPLICATION NO. : 10/669083
DATED : March 6, 2007
INVENTOR(S) : Eric Picollet and Michael Minondo It is certified that error appears in the above-identified patent and that said Letters Patent is hereby corrected as shown below:

Column 19, line 61, delete "determining an estimated capacitance of the circuit component by";

Column 19, line 63, delete "." and insert --; and storing the sum as an estimated capacitance of the circuit component.--.

Signed and Sealed this

Twenty-fifth Day of March, 2008

JON W. DUDAS
*Director of the United States Patent and Trademark Office*